(12) United States Patent
Guo et al.

(10) Patent No.: US 7,750,620 B2
(45) Date of Patent: Jul. 6, 2010

(54) MTJ SENSOR BASED METHOD TO MEASURE AN ELECTRIC CURRENT

(75) Inventors: Yimin Guo, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/321,841

(22) Filed: Jan. 26, 2009

(65) Prior Publication Data

US 2009/0201018 A1  Aug. 13, 2009

Related U.S. Application Data

(62) Division of application No. 11/788,912, filed on Apr. 23, 2007, now Pat. No. 7,483,295.

(51) Int. Cl.
*G01R 15/18* (2006.01)
*G01R 11/00* (2006.01)
(52) U.S. Cl. .................... 324/117 R; 365/158
(58) Field of Classification Search .......... None
See application file for complete search history.

(56) References Cited

U.S. PATENT DOCUMENTS

| 5,343,422 | A | 8/1994 | Kung et al. |
| 6,295,931 | B1 | 10/2001 | Cutler et al. |
| 6,341,053 | B1 * | 1/2002 | Nakada et al. |
| 6,930,479 | B2 | 8/2005 | Xiao et al. |
| 7,394,247 | B1 * | 7/2008 | Guo et al. |
| 7,394,248 | B1 * | 7/2008 | Guo et al. |
| 7,483,295 | B2 * | 1/2009 | Guo et al. |
| 7,635,974 | B2 * | 12/2009 | Guo et al. |
| 2006/0071655 | A1 | 4/2006 | Shoji |
| 2006/0170529 | A1 | 8/2006 | Shoji |
| 2006/0209590 | A1 * | 9/2006 | Guo et al. |
| 2008/0258721 | A1 * | 10/2008 | Guo et al. |
| 2008/0272771 | A1 * | 11/2008 | Guo et al. |
| 2009/0184704 | A1 * | 7/2009 | Guo et al. |

* cited by examiner

*Primary Examiner*—Jermele M Hollington
(74) *Attorney, Agent, or Firm*—Saile Ackerman LLC; Stephen B. Ackerman

(57) ABSTRACT

By subdividing the free layer of a GMR/TMR device into multiple sub-elements that share common top and bottom electrodes, a magnetic detector is produced that is domain stable in the presence of large stray fields, thereby eliminating the need for longitudinal bias magnets. Said detector may be used to measure electric currents without being affected by local temperature fluctuations and/or stray fields.

4 Claims, 3 Drawing Sheets

MTJ SENSOR BASED METHOD TO MEASURE AN ELECTRIC CURRENT

This is a divisional application of U.S. patent application Ser. No. 11/788,912 filed on Apr. 23, 2007, now U.S. Pat. No. 7,483,295 which is herein incorporated by reference in its entirety, and assigned to a common assignee.

FIELD OF THE INVENTION

The invention relates to the general field of magnetic field detection by MTJ or GMR devices with particular reference to free layer stability.

BACKGROUND OF THE INVENTION

The present invention relates to a magnetic field sensor using a highly sensitive MTJ (magnetic tunnel junction) device. Its applications include use as a current sensor capable of sensing very small changes in the current flowing through a conductor.

In a conventional current sensor, the sensing elements are two long GMR (Giant Magneto Resistance) bearing stripes disposed adjacent to a conductor to be measured in an in-plane direction[1,2]. Such a current sensor includes: the conductor bent into a U shape; first and second GMR elements located on the conductor on opposing legs of the U so that a magnetic field generated by a nearby conductor will induce opposite magneto-resistance changes in the two GMR devices; and first and second constant current sources that supply constant and equal currents to the first and second GMR elements. The current sensor further includes a differential amplifier that detects the difference between the voltage drops across the first and second GMR elements. The field current is then detected based on the difference between the two voltage drops.

The scheme described above is schematically illustrated in FIG. 1. As can be seen, the two GMR devices 11 and 12 both lie on the U-shaped current sensor, but on opposing legs thereof. Consequently, the reference layers of the two magnetic sensing devices 11 and 12 are pinned in opposite directions (relative to the magnetic fields generated by the current in each leg) thereby ensuring that their resistances will change by different amounts when exposed to a magnetic field generated by the same current I. An important feature of this structure is that it is insensitive to the influence of noise from undesired external small magnetic fields as well as to resistance variations due to temperature change.

If this scheme is to work properly, the magnetization of each GMR element's free layer has to remain in a single domain state. However, a large external magnetic field (one greater than about 60 Oe) could change the single domain state of a GMR or MTJ free layer into multiple domain states, leading to hysteresis of the magnetic response and causing current reading errors. To address this problem, the prior art device discussed above includes means for imposing on the free layer a longitudinal magnetic bias. Said means take the form of a pair of permanent or exchange coupled magnets, one such pair for each sensor. Aside from the additional cost that this adds to the manufacturing process, use of longitudinal bias will also reduce the sensitivity of the device which may be further degraded by changes in the permanent bias over time.

The present invention discloses a structure (and process for its manufacture) having a magnetic free layer that is domain stable without the need for longitudinal bias magnetization.

[1] US 2006/0071655
[2] US 2006/0170529

A routine search of the prior art was performed with the following references of interest being found:

U.S. Patent Applications 2006/0071655 and 2006/0170529 (Shoji) disclose first and second MTJ elements with resistance values opposite to each other and a differential amplifier to detect the difference between voltage drops. U.S. Pat. No. 6,930,479 (Xiao et al) shows an MTJ current sensor for a scanning magnetic microscope. U.S. Pat. No. 6,295,931 (Cutler et al) discloses MTJ magnetic field sensors.

SUMMARY OF THE INVENTION

It has been an object of at least one embodiment of the present invention to provide a GMR or TMR based magnetic field sensor whose free layer is domain stable without the need for longitudinal bias stabilization.

Another object of at least one embodiment of the present invention has been to apply said magnetic sensor to a method for measuring an electric current.

Still another object of at least one embodiment of the present invention has been to provide a method for manufacturing said domain stable magnetic field sensor.

A further object of at least one embodiment of the present invention has been that said method for measuring an electric current be impervious to local temperature fluctuations and to local external field variations.

These objects have been achieved by subdividing the free layer into two or more elements that share the following characteristics: (1) they have an aspect ratio of at least 1.2 and (2) their long dimension is less than the width of the Néel wall that normally separates magnetic domains from one another. For a typical free layer thickness of about 30 Angstroms, this is about 2 microns. This translates to a maximum long dimension for one of the elements of about 1. Since the elements are too small for the formation of more than one magnetic domain, they are domain stable even in the presence of large external magnetic fields.

A major advantage of the structure (and method) of the present invention is that it eliminates any need to impose a longitudinal bias on the free layer for the purpose of rendering it domain stable. This allows the associated bias magnets to be omitted, thereby reducing the cost of the device as well as increasing its sensitivity.

A useful application of the present invention is as part of a current measuring device. Two of these magnetic sensors are disposed to lie on opposing legs of a current loop and the difference in the voltage drop across each device is measured. Said differential voltage is amplified and the result equated to the current flowing through the loop. The absence of bias magnets allows this version of this type of current detector to be more compact than its prior art counterparts, an important feature wherever space (e.g. chip real estate) is at a premium.

DESCRIPTION OF THE PREFERRED EMBODIMENTS

As noted above, a large external magnetic field (one greater than about 60 Oe) could change the single domain state of the GMR or MTJ free layer into multiple domain states, leading to hysteresis of the magnetic response and causing current reading errors. To address this problem, the prior art device discussed above includes means for giving the free layer magnetization a longitudinal bias. Said means take the form of a pair of permanent or exchange coupled magnets, one such pair for each sensor. Aside from the additional cost that this adds to the manufacturing process use of longitudinal bias will also reduce the sensitivity of the device as well as introducing further degradation due to changes in the permanent bias over time.

In a ferromagnetic thin film, magnetic exchange interaction between adjacent grains is so strong that magnetization directions in neighboring grains are aligned or nearly aligned. In a typical free layer film of thickness 2-5 nm, the Néel wall width (i.e., the width of a magnetic domain wall in a thin ferromagnetic film) exceeds 1.0 mm. So if the maximum dimension of an isolated area of ferromagnetic material is smaller than the width of the magnetic domain wall, said area cannot become a multi-domain structure even if it is subjected to excitation by a large external magnetic field. As a result, it cannot exhibit any hysteresis in its magnetic response curve. For a more detailed discussion see, for example, U.S. Pat. No. 5,343,422, K. T. Kung, et al.

Figure 1:
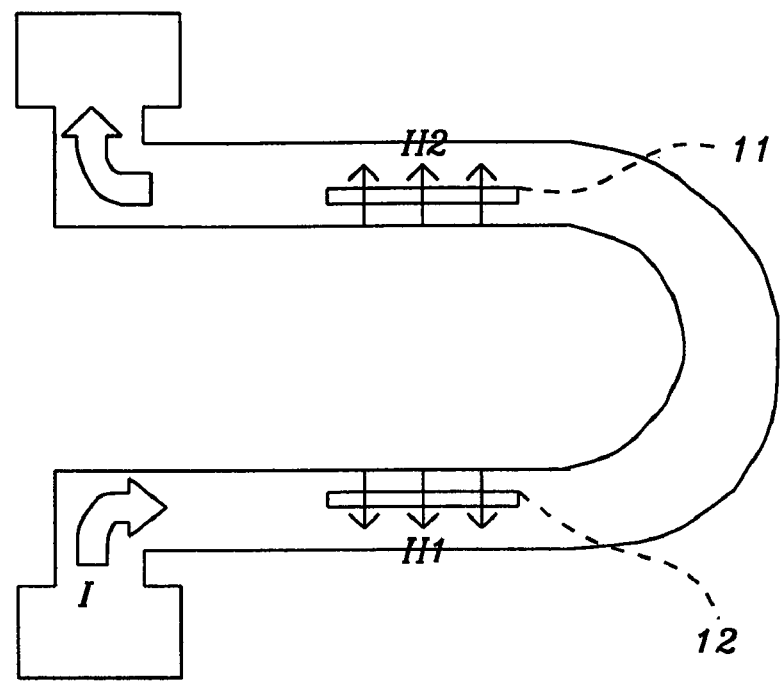
FIG. 1 shows a GMR/TMR based current measuring apparatus of the prior art.
Figure 2:
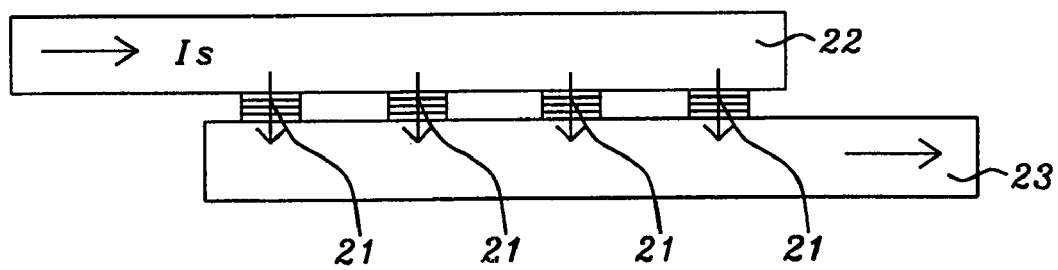
FIG. 2 illustrates how a free layer may be subdivided into multiple sub-elements.

As noted earlier, the principal object of the present invention is to describe a sensor, for magnetic fields or electric current measurement, that does not require providing longitudinal bias magnetization for the free layer by external means such as permanent magnets. As shown in FIG. 2, each primary MTJ sensing structure comprises a group of mini MTJ sensing elements 21, patterned as small non-circular cells that share common top and bottom electrodes 22 and 23 respectively. These mini MTJ elements have identical shapes and are electrically in parallel. During a sensing operation, the total electric current is equally available to each mini MTJ element. When a magnetic field is present, the mini MTJ elements give their individual responses, the total voltage signal generated by the primary MTJ sensor thus being an average of the individual voltages generated by the multiple mini MTJ sensing elements.

Figure 3:
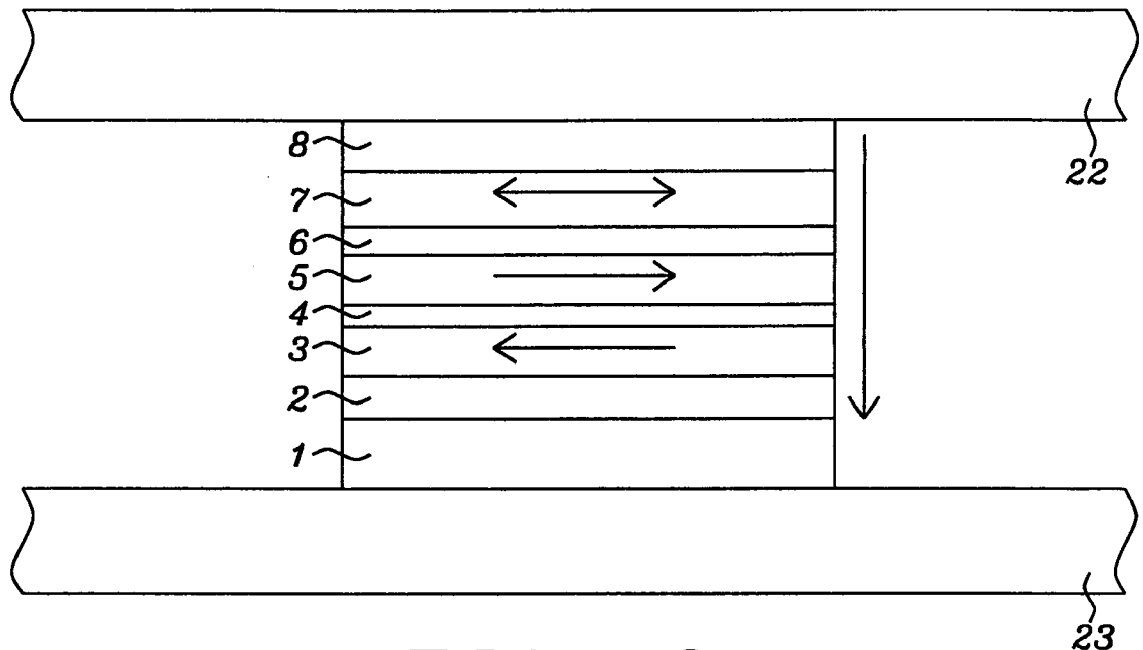
FIG. 3 is a schematic cross-sectional view of one of said sub-elements.

As shown in FIG. 3, each MTJ cell is processed by deposition of: first an under-layer 1 is deposited on top of preformed bottom electrodes such as 23, then anti-ferromagnetic (AFM) layer 2 is deposited, then a synthetic pinned multi-layer substructure (pinned magnetic layer 3/AFM coupling layer 4/pinned reference layer 5) is deposited followed by separation layer 6. Layer 6 takes the form of a tunneling barrier layer if a TMR device is being fabricated or it may be a conductive spacer layer (typically copper) if a GMR device is being formed. Free layer 7 is deposited onto separation layer 6 and then capping layer 8 is laid down.

Note that, in at least one embodiment of the invention the free layer may also have the form of a synthetic antiferromagnetic configuration (i.e. antiparallel coupling between two ferromagnetic layers). These ferromagnetic layers are given different magnetic moments, resulting in a non-zero net moment for the structure, which now behaves as a single free layer (having said net moment).

Next, in a key departure from prior art practice, using standard photolithographic processes, layers 1 through 8 are patterned into multiple small MTJ stacks having an aspect ratio of preferably about 2 but of at least 1.2, with both their short axis and exchange (AFM) pinned direction (through thermal annealing within a large magnetic field) parallel to the conductor current induced field direction. After backfilling with dielectric material and the application of CMP (chemical mechanical polishing) processes, top electrode 22 is deposited to connect the plurality of MTJ stacks.

Each MTJ stack will generally be given an ellipse-like shape (when seen in plan view), but other shapes whose aspect ratio (long axis length:short axis length) is at least 1.2 and preferably greater than 2, such as rectangles with curved corners.

Exactly how the stacks 21 are laid out within the area defined by the top and bottom electrodes of devices 41 and 42 will depend on the magnitude and shape of the available space. Most typically, they would be uniformly disposed to lie on one or more parallel straight lines as exemplified in FIG. 4, but any non-touching arrangement within the available area would work.

As a special application, the MTJ structures described above can be used as part of an electric current sensor. In this structure, the sensor has two identical MTJ structures which are disposed in different locations and adjacent to a conductor to be measured in an in-plane direction, such that two MTJ structures experience the same conductor current induced magnetic fields but with opposite directions, H1 and H2, as shown in FIG. 4.

Figure 4:
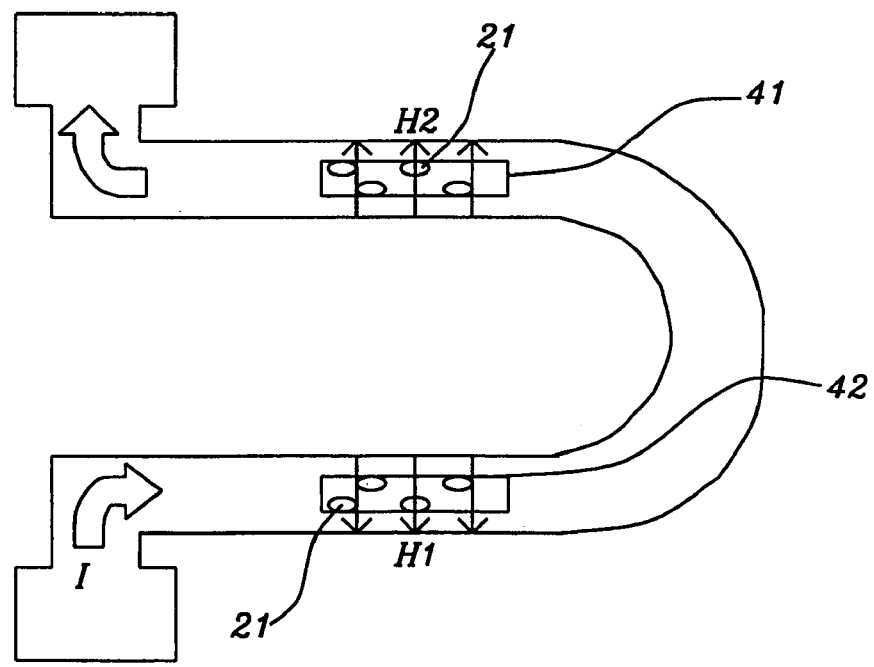
FIG. 4 shows the application of the present invention to a method for measuring an electric current.

FIG. 4 is a schematic illustration of a structure utilizing the present invention as an electric current sensor. Electric current I flows between the two ends of the device causing the appearance of sensing currents in both MTJ structures. Arrows on the MTJ sensing structures represent magnetic fields generated by the current (flowing in the U-shaped conductor) which are to be measured.

In the application, MTJ sensing structure resistance values change in directions opposite to each other in accordance with the magnetic field generated by the current that is to be detected. A constant current source supplies a constant current to each of the MTJ structures. Due the shape anisotropy, all MTJ free layer magnetizations in the two MTJ sensors are aligned along their long axis directions. When a field is generated by the conductor current, all magnetizations in the MTJ sensors will rotate toward the field direction that they sense.

The magnetic field or electric current sensor further includes a differential amplifier that detects the difference between voltage drops occurring in the first and second MTJ structures along the constant current. The current to be measured is detected through this difference between the voltage drops. Since the MTJ signal is proportional to the cosine of the angle between its magnetization and pinned reference layer magnetization, quiescent magnetizations in each cell can be in either direction of their long axes. As long as magnetization in each free layer is maintained in a single domain state, said state having being achieved by according to the teachings of the present invention, signal output will be hysteresis-free. Thus, this sensor can tolerate any external stray field.

Figure 5A:
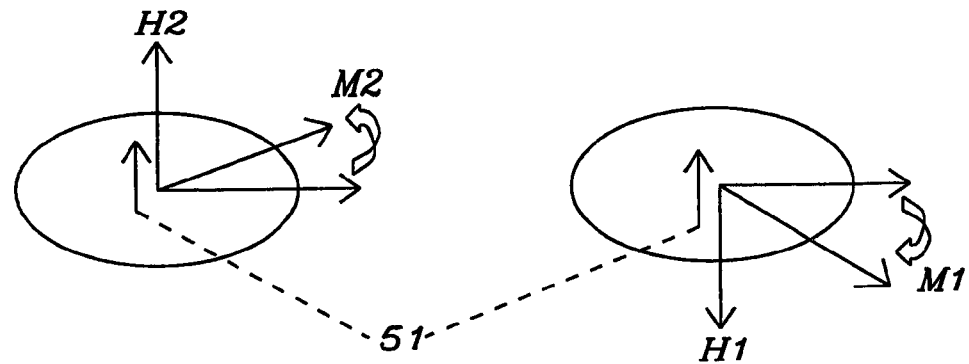
FIGS. 5a and 5b illustrate the effect of the current generated magnetic field on the net magnetization, in the plane of the device, of each GMR/TMR free layer.
Figure 5B:
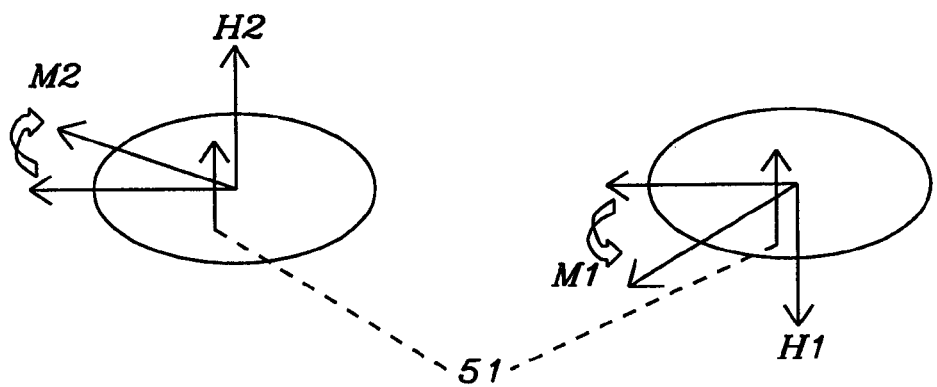

For example, although the quiescent magnetizations shown in FIG. 5a and FIG. 5b are different (as might be caused by an external stray field), their differential voltage output would still give the same signal response. In these two figures, vectors 51 represent the magnetization of the pinned layer (5 in FIG. 3). H1 and H2 represent the magnetic fields generated by the conductor current at the first and second locations respectively, while M1 and M2 represent magnetization of first chip 41 and second chip 42 at the first and second locations respectively. Note that all magnetization vectors shown here lie in the plane of the paper.

Figure 6:
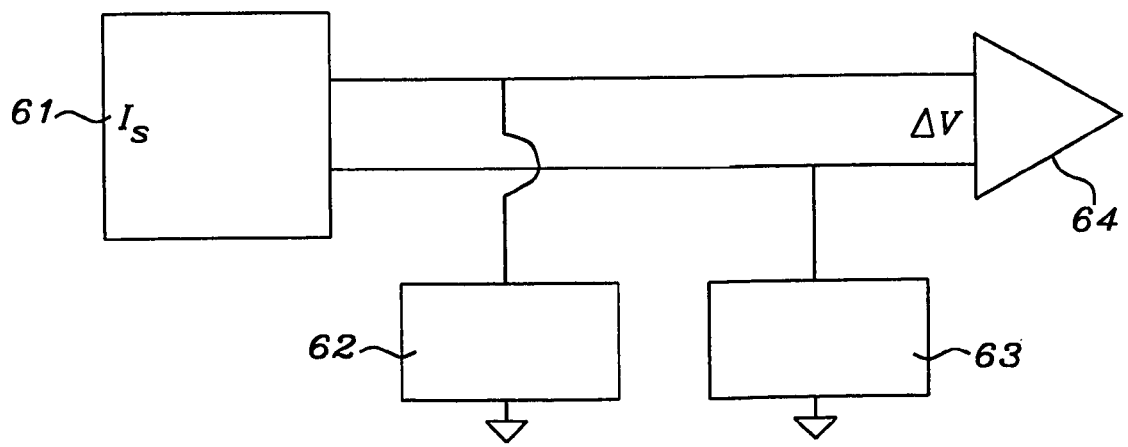
FIG. 6 is a schematic view of the circuit used by the current measuring device.

FIG. 6 shows a schematic representation of the circuit used to make the required current measurement. Seen there are constant current source 61, MTJ (or GMR) detectors 62 and 63, and voltage differential amplifier 64.

What is claimed is:

1. A method to measure an electric current, comprising:
   providing a pair of conductive wires having corresponding first and second ends, said pair of wires being disposed so as to be equidistant over their full extents, said corresponding first ends being electrically connected to each other;
   placing, on each of said wires, a magnetic sensor having top and bottom leads, between which a voltage drop occurs in the presence of a magnetic field, and dividing each such sensor into a group of mini MTJ sensing elements each of which includes a free layer and a reference layer having pinned magnetization, each of said mini MTJ sensing elements sharing said top and bottom leads and having, in plan view, an aspect ratio of at least 1.2 and a length dimension of at most 1 micron whereby each such free layer is domain stable in the presence of a magnetic field, each of said pinned magnetizations being in a direction that is perpendicular to said length direction;
   passing said current between said corresponding second ends, thereby generating a magnetic field whose direction is different relative to each of the magnetic sensors whereby said magnetic sensors generate voltage drops whose magnitudes differ from one another;
   measuring said difference in magnitude between said voltage drops; and
   thereby deriving a value for said electric current.

2. The method of claim 1 wherein said magnetic sensor is selected from the group consisting of MTJ devices and CPP GMR devices.

3. The method of claim 1 further comprising providing a source of constant current for driving said magnetic sensors.

4. The method of claim 1 wherein the step of measuring said difference in magnitude between said voltage drops is achieved through use of a differential voltage amplifier.

* * * * *